United States Patent
Yan et al.

(10) Patent No.: US 10,811,958 B2
(45) Date of Patent: Oct. 20, 2020

(54) WATER-COOLING POWER SUPPLY MODULE

(71) Applicant: Delta Electronics (Shanghai) CO., LTD, Shanghai (CN)

(72) Inventors: Chao Yan, Shanghai (CN); Liping Sun, Shanghai (CN); Gemin Pang, Shanghai (CN); Jian Zhu, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 0 days.

(21) Appl. No.: 16/258,803

(22) Filed: Jan. 28, 2019

(65) Prior Publication Data
US 2019/0245433 A1 Aug. 8, 2019

(30) Foreign Application Priority Data
Feb. 5, 2018 (CN) .......................... 2018 1 0110626

(51) Int. Cl.
*H02M 1/44* (2007.01)
*H01R 12/52* (2011.01)
(Continued)

(52) U.S. Cl.
CPC .............. *H02M 1/44* (2013.01); *H01R 12/52* (2013.01); *H02M 7/003* (2013.01); *H05K 1/0216* (2013.01); *H05K 1/0243* (2013.01); *H05K 1/181* (2013.01); *H05K 7/1427* (2013.01); *H05K 7/20254* (2013.01); *H05K 7/20927* (2013.01); *H05K 2201/1003* (2013.01); *H05K 2201/1006* (2013.01); *H05K 2201/10015* (2013.01);
(Continued)

(58) Field of Classification Search
CPC ...................... H05K 7/20872; H05K 7/20927
See application file for complete search history.

(56) References Cited

U.S. PATENT DOCUMENTS 8,061,412 B2 * 11/2011 Ippoushi ............... H01L 23/473
165/185
9,066,453 B2 * 6/2015 Wagner ................ H05K 1/0203
(Continued)

FOREIGN PATENT DOCUMENTS

CN 201509156 U 6/2010
CN 102132480 A 7/2011
(Continued)

OTHER PUBLICATIONS

The CN1OA issued Dec. 2, 2019 by the CNIPA.
The CN2OA dated Sep. 3, 2020 by the CNIPA.

*Primary Examiner* — Mukundbhai G Patel
(74) *Attorney, Agent, or Firm* — Yunling Ren

(57) ABSTRACT

The invention provides a water-cooling power supply module, comprising: a water-cooling plate; a power supply module disposed on the water-cooling plate, comprising: a capacitor module, a power module, a plurality of inductor modules and input/output filter module arranged in sequence on the surface of the water-cooling plate, and a control module disposed above the capacitor module or the power module at least used for controlling the power module; wherein water channels in the water-cooling plate are designed such that the cooling water flows through the power module, the inductor modules and the input/output filter module in sequence.

20 Claims, 20 Drawing Sheets

(51) Int. Cl.
    *H05K 7/20*           (2006.01)
    *H05K 7/14*           (2006.01)
    *H05K 1/18*           (2006.01)
    *H05K 1/02*           (2006.01)
    *H02M 7/00*          (2006.01)

(52) U.S. Cl.
    CPC .............. *H05K 2201/10053* (2013.01); *H05K 2201/10181* (2013.01)

(56) References Cited

U.S. PATENT DOCUMENTS

| | | |
|---|---|---|
| 9,620,292 B2 * | 4/2017 | Wen ....................... H02M 7/003 |
| 2012/0024513 A1 | 2/2012 | Ippoushi |
| 2013/0235527 A1 | 9/2013 | Wagner et al. |
| 2016/0094148 A1 * | 3/2016 | Ni ........................... H02J 3/383 |
| | | 363/95 |
| 2018/0168075 A1 * | 6/2018 | Okazaki ............. H05K 7/20272 |
| 2018/0342943 A1 * | 11/2018 | Yuan ....................... H02M 1/32 |

FOREIGN PATENT DOCUMENTS

| | | |
|---|---|---|
| CN | 203086319 U | 7/2013 |
| CN | 203233636 U | 10/2013 |
| CN | 104201982 A | 12/2014 |
| CN | 104952859 A | 9/2015 |
| CN | 206180827 U | 5/2017 |
| CN | 106921299 A | 7/2017 |
| WO | 2016186102 A1 | 11/2016 |

\* cited by examiner

Connecting Module(a)   Connecting Module(b)   Connecting Module(c)

WATER-COOLING POWER SUPPLY MODULE

CROSS REFERENCE

This application is based upon and claims priority to Chinese Patent Application No. 201810110626.6, filed on Feb. 5, 2018, the entire contents thereof are incorporated herein by reference.

TECHNICAL FIELD

The present invention relates to the field of power electronics, and particularly to a water-cooling power supply module.

BACKGROUND

FIG. 1 shows the circuit topology of a commonly used high-power power supply module, including an EMI filter, an AC/DC (i.e., an alternating current/direct current converter), an electrolytic capacitor and a DC/DC converter. Such a circuit topology is widely used in solar inverters, automotive charging piles and battery energy storage due to its high power factor and wide output range.

By means of water cooling, which has the strongest cooling capacity, as compared with air cooling, the power density of the power supply module can be greatly improved. By designing reasonable layouts, the noise and interference problems caused by high-frequency switching of power electronic devices can be effectively solved by using the high-power power supply module with excellent heat dissipation.

The above information is disclosed herein only for the purpose of improving the understanding to the background of the invention, and thus it may include those that do not constitute the prior art known to those of ordinary skill in the art.

SUMMARY OF THE INVENTION

The present invention discloses a water-cooling power supply module, to overcome at least to some extent one or more problems due to limitations and disadvantages of the related art.

Other features and advantages of the present invention will be apparent from the following description or by implementing the present invention.

According to one embodiment of the present invention, a water-cooling power supply module is provided, including: a water-cooling plate; a power supply module disposed on the water-cooling plate, including: a capacitor module, a power module, at least one inductor module, and an input/output filter module arranged on the surface of the water cooling plate; and a control module disposed above the capacitor module or the power module to be used for at least controlling the power module; wherein water channels in the water-cooling plate are designed such that cooling water flows through the power module, the inductor modules and the input/output filter module in sequence.

According to one embodiment of the present invention, one end of each inductor module is electrically connected to the input/output filter module, and the other end is electrically connected to the power module, and the current is transferred between the input/output filter module and the power module via of the at least one inductor module.

According to one embodiment of the present invention, a plurality of support columns are disposed at opposite ends of the capacitor module or the power module, and a support plate and an insulating pad are disposed on the plurality of support columns, and the control module is disposed on the insulating pad.

According to one embodiment of the present invention, a plurality of support columns are disposed on one end of the capacitor module or the power module, and the other end of the capacitor module or the power module is adjacent to a housing of the water-cooling power supply module; a support plate is disposed on the plurality of support columns, and one end of the support plate is supported by the plurality of support columns and the other end of the support plate is supported by the housing; an insulating pad is disposed on the support plate; and the control module is disposed on the insulating pad.

According to one embodiment of the present invention, the capacitor module includes a plurality of electrolytic capacitors, a PCB board and connecting terminals, and a plurality of electrolytic capacitors and the connecting terminals are disposed on the PCB board; the power module includes switching devices, a driving circuit, high voltage filter capacitors, a PCB board and connecting terminals, and the switching devices, the driving circuit, the high voltage filter capacitors and the connecting terminals are disposed on the PCB board; each inductor module includes a single inductor or multiple inductors, a PCB board and connecting terminals, and the single inductor or the multiple inductors and the connecting terminals are disposed on the PCB board; the input/output filter module includes common mode inductors, differential mode inductors, a Y capacitor, a X capacitor, relays, fuses, electrolytic capacitors, a PCB board, and connecting terminals, and the common mode inductors, the differential mode inductors, the Y capacitor, the X capacitors, the relays, the fuses, the electrolytic capacitors and the connecting terminals are disposed on the PCB board; and the control module includes voltage and current sampling processing lines, control lines, communication lines, a PCB board and connecting terminals, and the voltage and current sampling processing lines, the control lines, the communication lines and the connecting terminals are disposed on the PCB board, wherein the control module is also used for the communication between the water-cooling power supply module and external devices.

According to one embodiment of the present invention, a connecting module is disposed on each of the PCB boards, and the PCB boards disposed between adjacent modules on the surface of the water cooling plate are electrically connected via the connecting modules.

According to one embodiment of the present invention, the connecting module includes a first connecting member and a second connecting member that mate with each other, and the sum of heights of the first connecting member and the second connecting member is equal to the height difference between adjacent PCB boards.

According to one embodiment of the present invention, one end of the first connecting member is provided with pins and is fixedly connected to one of the PCB boards by the pins and fasteners; one end of the second connecting member is provided with pins and is fixedly connected to the other PCB board by the pins and fasteners; and the other end of the first connecting member and the other end of the second connecting member are fixedly connected by fasteners.

According to one embodiment of the present invention, the connecting module includes a connecting member, the height of the connecting member is equal to the height difference between adjacent PCB boards, one end of the connecting member is provided with pins and is fixedly connected with one of the PCB boards by the pins and fasteners, and the other end of the connecting member is provided with screw holes and is fixedly connected to the other PCB board by fasteners.

According to one embodiment of the present invention, the PCB board in the capacitor module includes a plurality of layers, and a plurality of electrolytic capacitors form at least one set of zero terminals, positive terminals and negative terminals which are respectively laid on the different layers in the PCB board, and high-frequency currents in the adjacent layers of the PCB board in the capacitor module flow in opposite directions.

According to one embodiment of the present invention, at least one set of positive bus terminals, neutral terminals and negative bus terminals are disposed on the PCB board of the power module, wherein each set of positive terminals, zero terminals and negative terminals on the PCB board of the capacitor module are electrically connected to a set of positive bus terminals, neutral terminals and negative bus terminals on the PCB of the power module.

According to one embodiment of the present invention, the plurality of electrolytic capacitors form two or more sets of positive terminals, zero terminals and negative terminals, and a DC bus of the power module has two or more sets of positive bus terminals, neutral terminals and negative bus terminals.

According to one embodiment of the present invention, the power supply module further includes at least one input terminal and at least one output terminal, and the at least one input terminal and the at least one output terminal are located on the same side of the power supply module and are connected to the input/output filter module.

According to one embodiment of the present invention, the at least one inductor module includes AC/DC inductor modules and a DC/DC inductor module, a main current is sequentially transmitted to the input/output filter module, the AC/DC inductor modules, the power module, the capacitor module and the power module via the at least one input terminal, and subsequently transmitted to the input/output filter module via the DC/DC inductor modules, and finally transmitted to external devices via the at least one output terminal, so as to form a C-shaped main power channel.

According to one embodiment of the present invention, the at least one inductor module includes a DC/DC inductor module, a main current is sequentially transmitted to the input/output filter module, the capacitor module, and the power module via the at least one input terminal, and subsequently transmitted to the input/output filter module via the DC/DC inductor module, and transmitted to external devices via the at least one output terminal, so as to form a C-shaped main power channel.

According to one embodiment of the present invention, the at least one inductor module includes an AC/DC inductor module, a main current is sequentially transmitted to the input/output filter module, the AC/DC inductor module, the power module, the capacitor module via the at least one input terminal, and subsequently transmitted to the input/output filter module, and transmitted to external devices via the at least one output terminal, so as to form a C-shaped main power channel.

According to one embodiment of the present invention, the water-cooling power supply module further includes a heat-conducting medium disposed between the capacitor module and the water-cooling plate.

According to one embodiment of the present invention, the water-cooling power supply module further includes a heat-conducting medium disposed between the input/output filter module and the water-cooling plate.

According to one embodiment of the present invention, the water-cooling power supply module further includes heat dissipating adhesive disposed between the power module and the water-cooling plate, and the thickness of the heat dissipating adhesive is less than 100 urn.

According to one embodiment of the present invention, a heat dissipating housing of the inductor module is filled with heat dissipating adhesive.

It should be understood that the above general description and the following detailed description are merely exemplary and are not intended to limit the invention.

BRIEF DESCRIPTION OF THE DRAWINGS

Above and other objects, features and advantages of the present invention will become more apparent from the detailed description of the embodiments with reference to the following figures.

DETAILED DESCRIPTION

Figure 1:
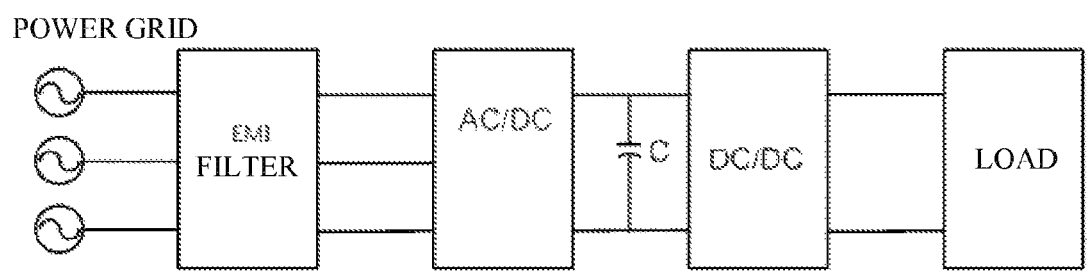
FIG. 1 shows a circuit topology of a commonly used high power supply module.

Hereinafter, the embodiments will be described in details with reference to the drawings. However, the embodiments can be implemented in a variety of forms and should not be construed as being limited to the examples set forth herein. In contrast, these embodiments are provided so that the description of the invention will be more comprehensive and complete and the concept of the present invention can be completely conveyed to those skilled in the art. The drawings are only schematic illustrations of the invention and are not necessarily to scale. The same reference numerals in the drawings denote the same or similar parts, and the repeated description thereof will be omitted.

Furthermore, the described features, structures or characteristics may be combined in any suitable manner in one or more embodiments. In the following description, numerous specific details are set forth so that the embodiments of the present invention can be completely understood. However, those skilled in the art will appreciate that the technical solution of the present invention may be practiced omitting one or more of the specific details, or employing other methods, components, steps, etc. In other instances, well-known structures, methods, implementations or operations are not shown or described in detail to avoid obscuring aspects of the invention.

Some of the block diagrams shown in the figures are functional entities and do not necessarily correspond to physically or logically separate entities. These functional entities may be implemented in software, or implemented in one or more hardware modules or integrated circuits, or implemented in different network and/or processor devices and/or microcontroller devices.

It is an object of the present invention to provide a water-cooling power supply module, including: a water-cooling plate and a power supply module disposed on the water-cooling plate. The power supply module includes: a capacitor module, a power module, a plurality of inductor modules, and an input/output filter module arranged in sequence on the surface of the water-cooling plate. The power supply module further includes a control module disposed above the capacitor module or the power module, which is used for controlling the power module. The water channels in the water-cooling plate are designed such that the cooling water flows through the power module, the inductor modules and the input/output filter module in sequence. By disposing the control module above the power module or the capacitor module, the disturbance to the control signal during transmission can be avoided. Since the water channels in the water-cooling plate are designed such that the cooling water flows through the power module, the inductor modules and the input/output filter module in sequence, each of those modules is cooled in sequence according to the loss, and the heat dissipation efficiency is improved accordingly. Due to a reasonable structure layout, the power supply module provided by the invention can fully utilize the space inside the module, and have a compact structure and high space utilization, and the power density of the whole machine can be increased accordingly.

Figure 2:
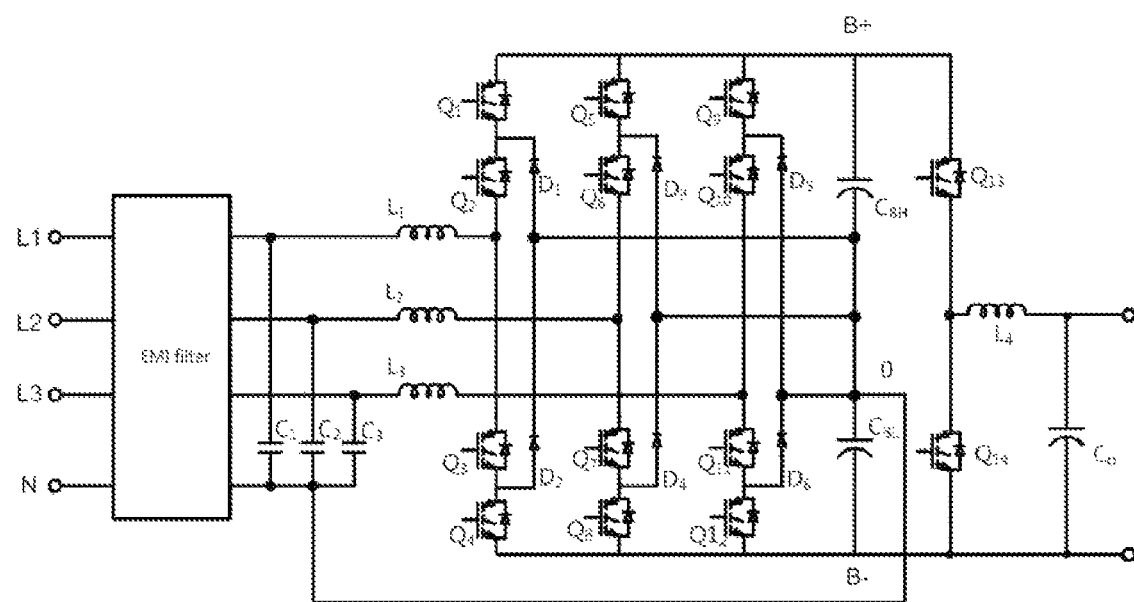
FIG. 2 shows a circuit diagram of a battery storage circuit.
Figure 3:
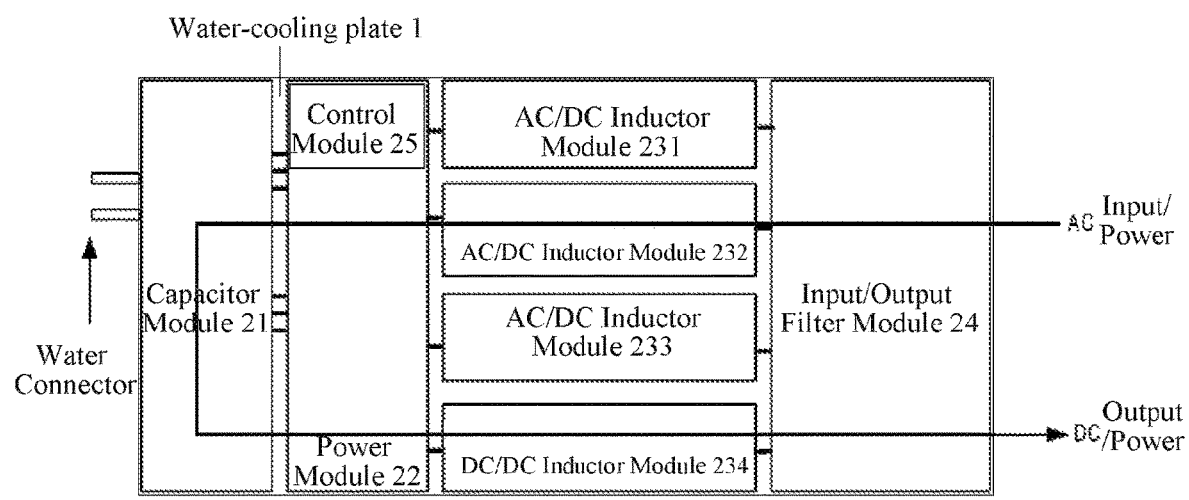
FIG. 3 shows a schematic diagram of a water-cooling power supply module according to one embodiment of the present invention.
Figure 5A:
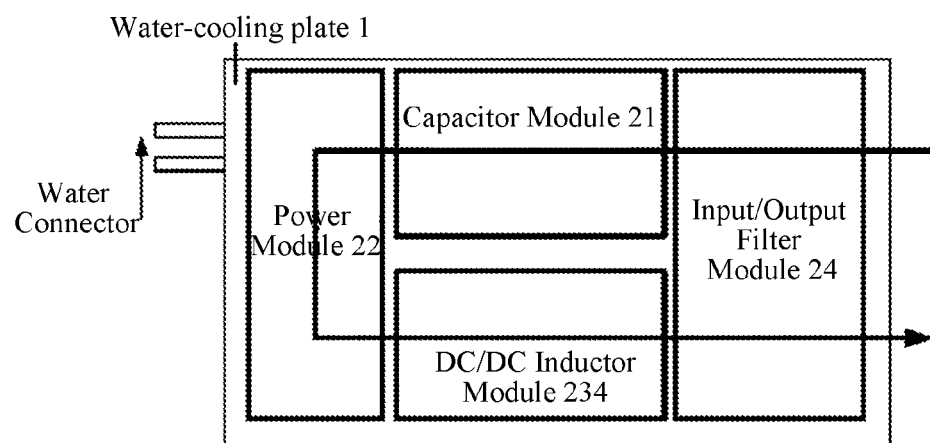
FIG. 5A and FIG. 5B show schematic diagrams of water-cooling power supply modules according to yet another alternative embodiments of the present invention.
Figure 6A:
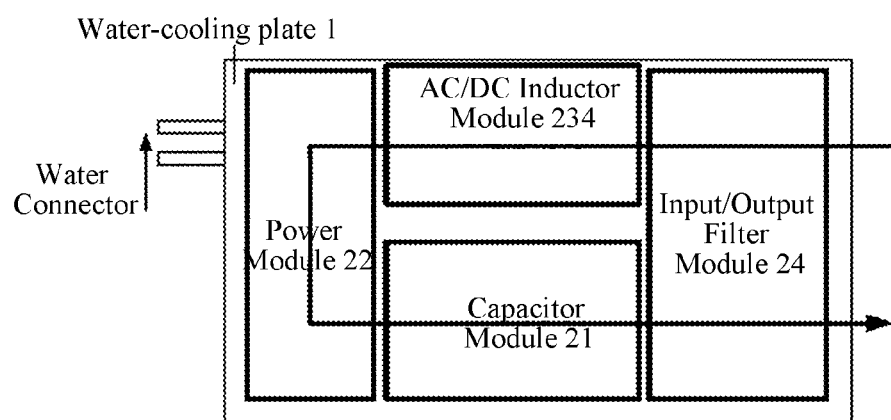
FIG. 6A and FIG. 6B show schematic diagrams of water-cooling power supply modules according to still another alternative embodiments of the present invention.
Figure 7:
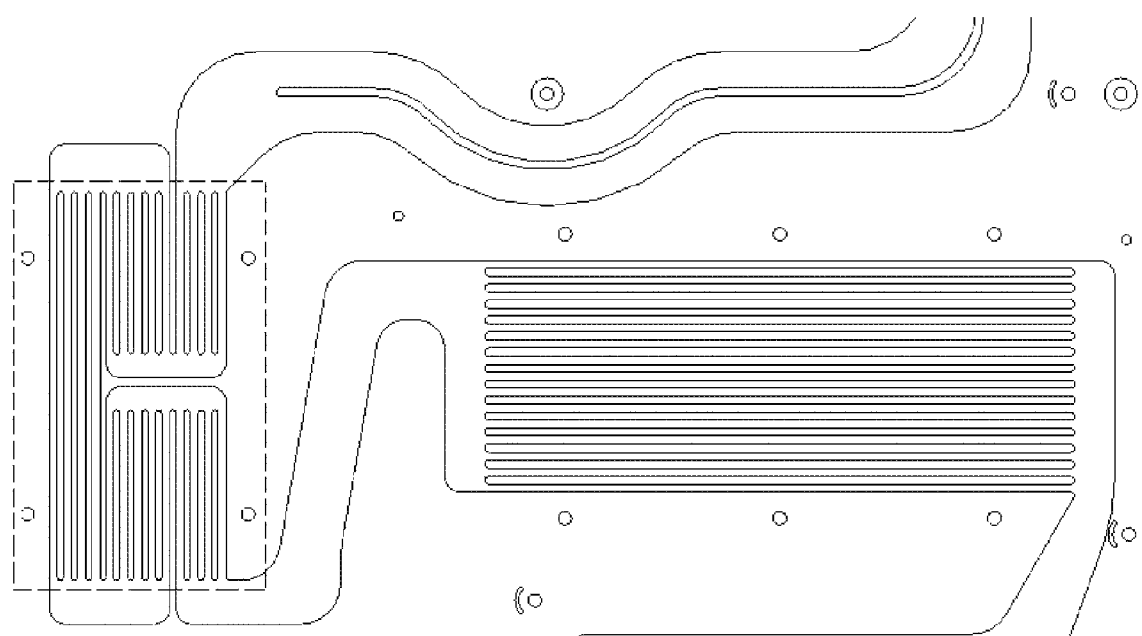
FIG. 7 shows a schematic view of the basic structure of a water-cooling plate.
Figure 8:
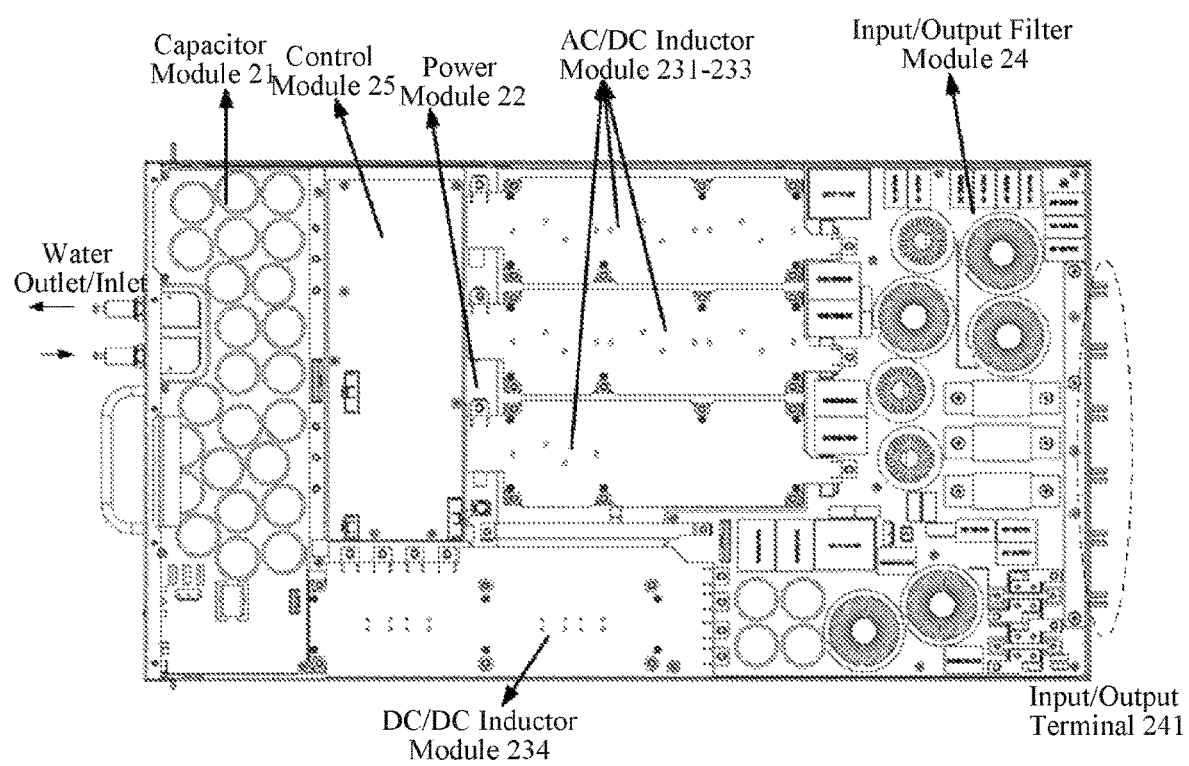
FIG. 8 shows a physical diagram of a water-cooling power supply module according to one embodiment of the present invention.
Figure 9:
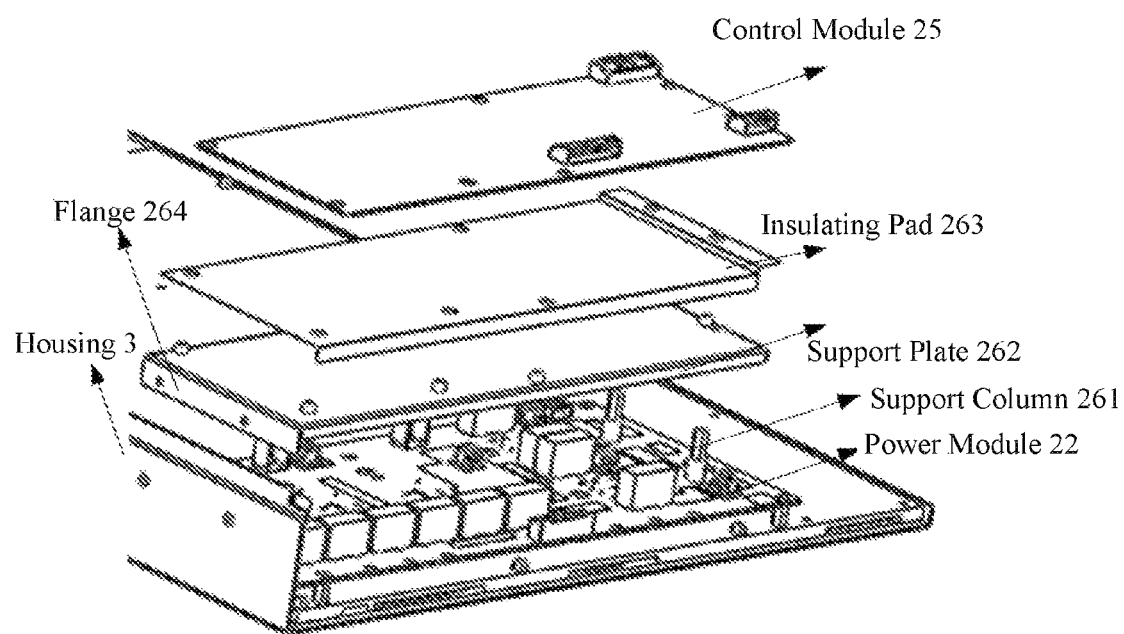
FIG. 9 shows a schematic installation view of a control module according to one embodiment of the present invention.
Figure 10:
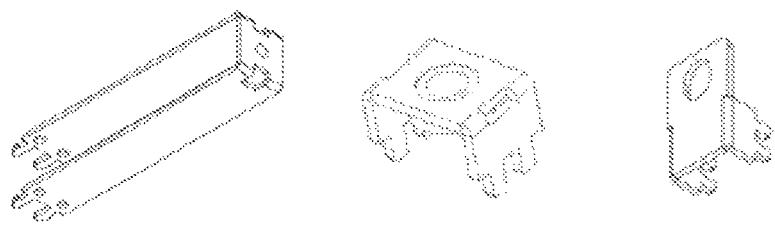
FIG. 10 shows a schematic diagram of a connecting module for connecting adjacent PCB boards.
Figure 11:
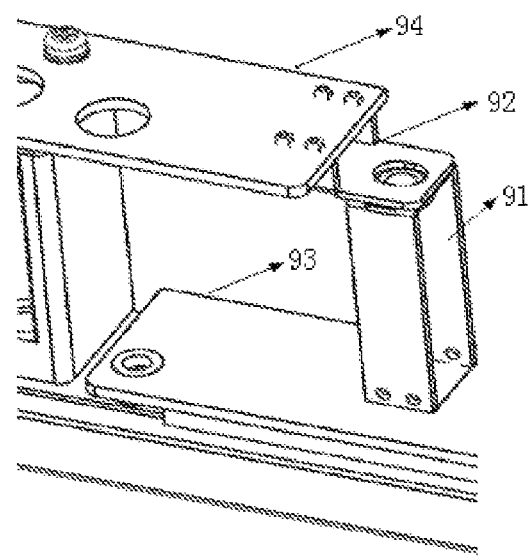
FIG. 11 shows a schematic diagram of a connecting module according to one embodiment of the present invention.
Figure 13:
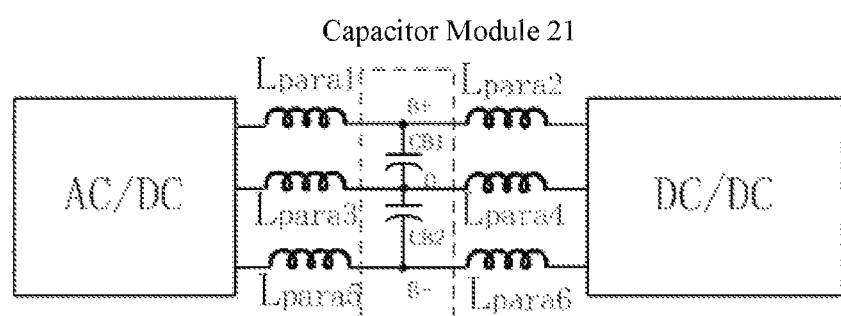
FIG. 13 shows an equivalent circuit analysis diagram of the parasitic inductance of the power module to the capacitor module.
Figure 14:
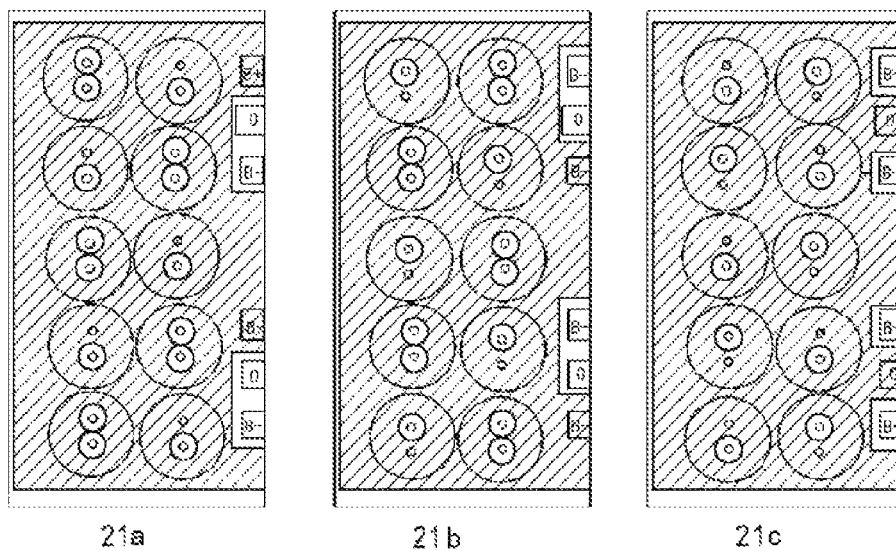
FIG. 14 shows a connection diagram of the capacitor terminals in the capacitor module.
Figure 15:
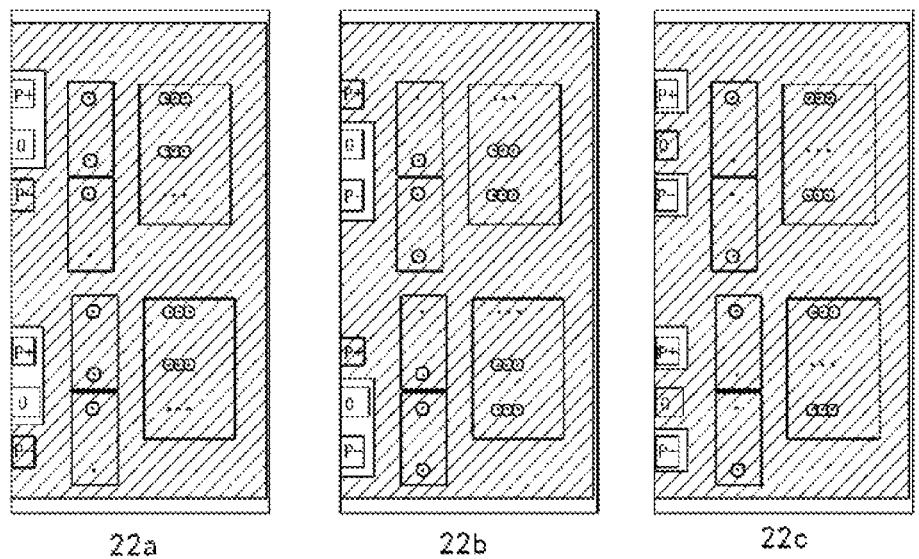
FIG. 15 shows a connection diagram of the power bus terminals in the power module.
Figure 16:
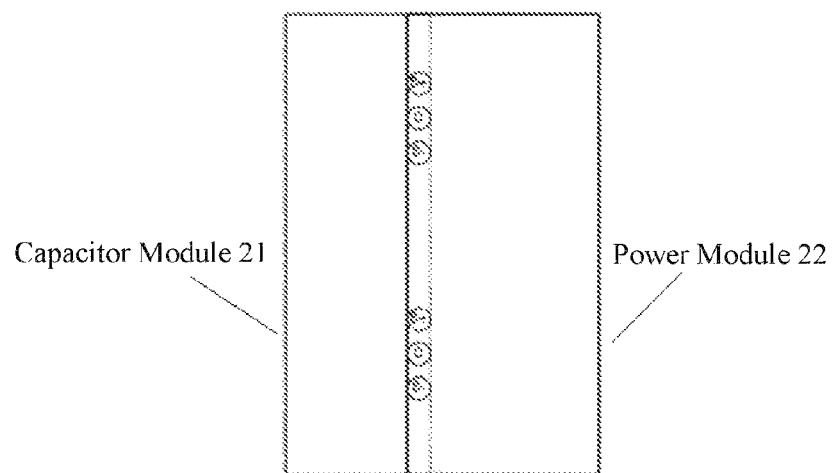
FIG. 16 shows a schematic diagram of the parallel connection between the power module and the capacitor module through two sets of terminals.
Figure 17:
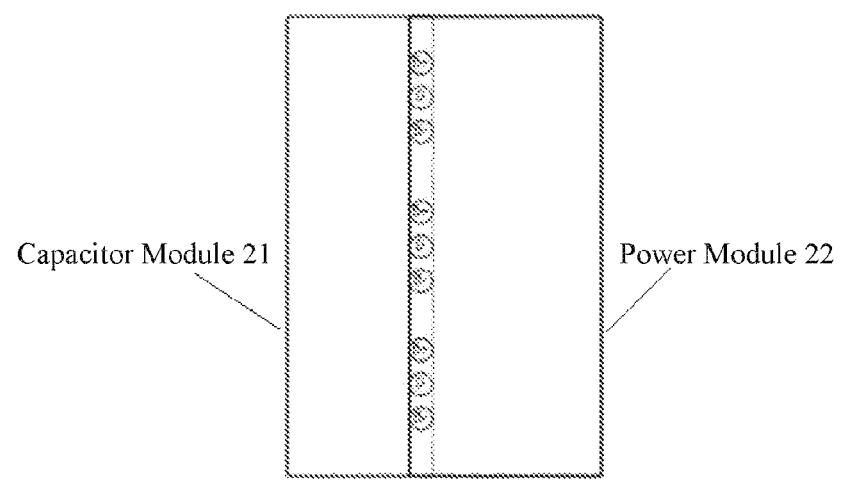
FIG. 17 shows a schematic diagram of the parallel connection between the power module and the capacitor module through three sets of terminals.
Figure 18:
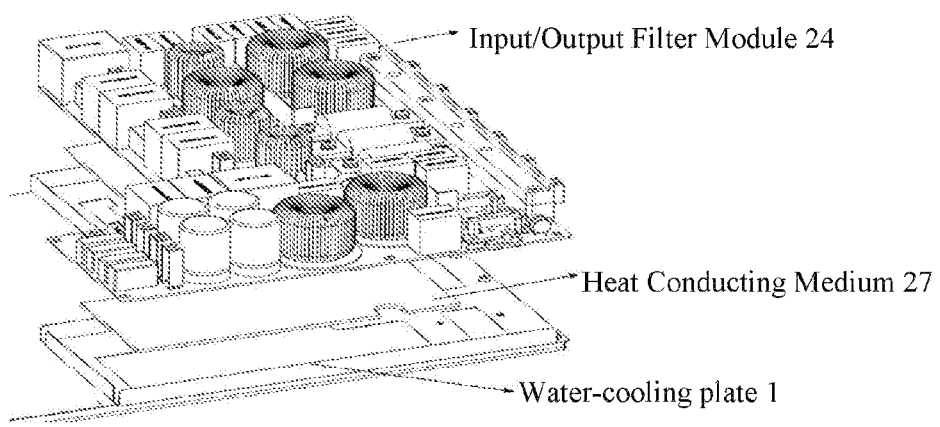
FIG. 18 shows a schematic diagram of the heat dissipation structure of the input/output filter module.

The water-cooling power supply module of the present invention will be described in detail below with reference to FIGS. 2-18. FIG. 2 is a circuit diagram of a battery storage circuit. FIG. 3 is a schematic diagram of a water-cooling power supply module according to one embodiment of the present invention. FIGS. 4, 5A, 5B, 6A and 6B are schematic diagrams of exemplary water-cooling power supply modules according to some alternative embodiments of the present invention. FIG. 7 is a schematic diagram showing the basic structure of the water-cooling plate. FIG. 8 is a physical diagram of a water-cooling power supply module according to one embodiment of the present invention. FIG. 9 is a schematic diagram showing the installation of the control module according to one embodiment of the present invention. FIG. 10 is a schematic diagram of a connecting module for connecting adjacent PCB boards. FIG. 11 is a schematic diagram of a connecting module according to one embodiment of the present invention. FIG. 13 is an equivalent circuit analysis diagram of the parasitic inductance of the power module to the capacitor module. FIG. 14 is a connection diagram of the capacitor terminals in the capacitor module. FIG. 15 is a connection diagram of the power bus terminals in the power module. FIG. 16 is a schematic diagram showing parallel connection between the power module and the capacitor module through two sets of terminals. FIG. 17 is a schematic diagram showing parallel connection between the power module and the capacitor module through three sets of terminals. FIG. 18 is a schematic diagram showing the heat dissipation structure of the input/output filter module.

FIG. 2 is the circuit diagram of the battery storage circuit. As shown in FIG. 2, A, B, C and N are respectively the three-phase lines and the neutral line of the three-phase alternating current circuit, C1-C3 are capacitors, L1-L4 are inductors, D1-D6 are diodes, Q1-Q14 is a switching device, and $C_{BH}$, $C_{BL}$ and $C_D$ are electrolytic capacitors. It is noted that the neutral line N does not need to be set in some applications. The structure pattern of the power supply module provided by the present invention is applicable to the battery storage circuit shown in FIG. 2, but is not limited thereto. The structure pattern of the power supply module provided by the present invention is also applicable to high-power applications such as the charging pile circuit (not shown in the figure), the solar inverter circuit (not shown in the figure).

The water-cooling power supply module according to one embodiment of the present invention will be described in detail below by taking the battery storage circuit shown in FIG. 2 as an example. As shown in FIG. 3, the water-cooling power supply module includes: a water-cooling plate 1; and a power supply module disposed on the water-cooling plate 1. The power supply module includes: a capacitor module 21, a power module 22, a plurality of inductor modules, and an input/output filter module 24 arranged on the surface of the water-cooling plate. Further, the capacitor module 21, the power module 22, the plurality of inductor modules, and the input/output filter module 24 are sequentially arranged on the surface of the water-cooling plate. The power supply module further includes a control module 25 disposed above the capacitor module or the power module, at least used for the control of the power module and for the communication of the system. The water channels in the water-cooling plate are designed such that the cooling water flows through the power module, the inductor module and the input/output filter module in sequence. By disposing the control module above the power module or the capacitor module, the disturbance to the control signal during transmission is avoided.

The input/output filter module 24, the plurality of inductor modules 231-234, the power module 22 and the capacitor module 21 are connected to form a main power channel, and the current flowing in the main power channel is collectively referred to as a main current. At least one input terminal and at least one output terminal of the power supply module are located on the same side of the power supply module and are connected to the input/output filter module. The plurality of inductor modules include three AC/DC inductor modules and a DC/DC inductor module. The main current is sequentially transmitted to the input/output filter module 24, the AC/DC inductor modules (231-233), the power module 22, the capacitor module 21, and the power module 22 via the at least one input terminal, and then transmitted to the input/output filter module via the DC/DC inductor module (234), and finally transmitted to the external device via the at least one output terminal, so as to form a C-shaped main power channel. The power module 22 includes two parts. In this embodiment, a part of the power module 22 implements AC/DC conversion and receives an alternating current transmitted by the AC/DC inductor modules (231-233); and another part of the power module 22 implements DC/DC conversion and transmits DC current to the DC/DC inductor module (234). Therefore, during the transmission of the main current, the power module 22 is passed twice to implement different current conversions, such as AC/DC conversion and DC/DC conversion. Since the main current is relatively large, the design of C-shaped main power channel can be contributed to reduce the length of the conduction loop, and the conduction loss can be decreased accordingly.

A plurality of inductor modules can include the AC/DC inductor modules 231-233 and the DC/DC inductor module 234. However, it should be particularly noted that since this embodiment takes the battery storage circuit (AC-to-DC) as an example, the inductor modules have the specific arrangement as described above, but the invention is not limited thereto. For example, when the water-cooling power supply module is employed in a solar inverter circuit (DC-to-AC), the inductor modules 231-233 will be configured as DC/AC inductor modules.

According to one embodiment of the present invention, one end of each inductor module is electrically connected to the input/output filter module, the other end is electrically connected to the power module, and the current is transmitted between the input/output filter module and the power module via a plurality of inductor modules. Since a plurality of inductor modules are used as connection bridges to achieve the interconnection between the power module 22 and the input/output filter module 24 during the current transmission, the connection is compact without extra jump wires and the circuit is very simple. Furthermore, since a plurality of inductor modules are used as connection bridges between the power module and the input/output filter module in the structure pattern provided by the present invention, not only the space utilization and the power density of the power supply module can be improved, but also the electromagnetic interference generated during current transmission can be avoided.

Figure 4:
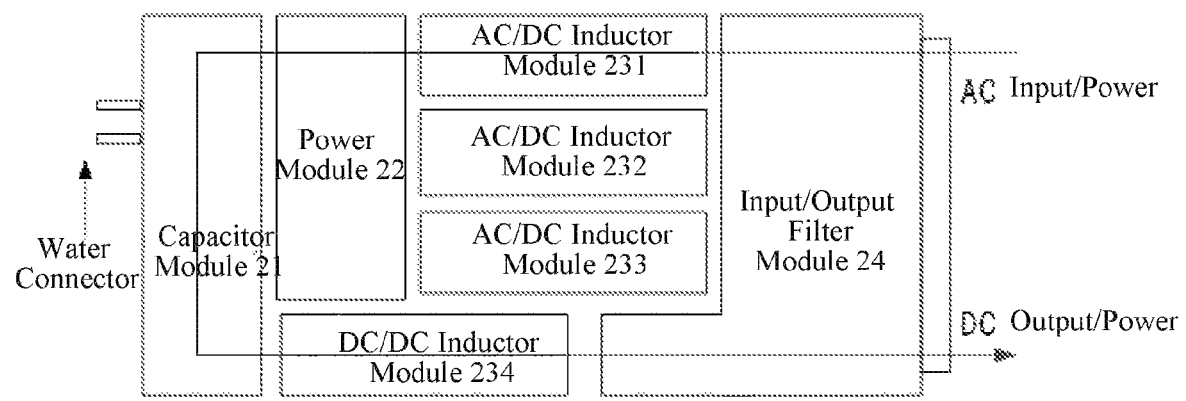
FIG. 4 shows a schematic diagram of a water-cooling power supply module according to another embodiment of the present invention.

FIG. 4 is a schematic diagram of a water-cooling power supply module according to another embodiment of the present invention. Compared with FIG. 3, the main structure pattern is similar, and the details will not be described herein again. It should be noted that, in practical applications, the shape of each module is not necessarily regular, for example, the input/output filter module in FIG. 4 is not a regular rectangle. Therefore, the position of each module in the structure pattern provided by the present invention can be reasonably arranged according to the shape of each module, respectively. In FIG. 4, according to the shape of the input/output filter module 24, the position of the DC/DC inductor module 234 can be flexibly designed, and the same technical effect as that of FIG. 3 can be achieved.

It should be noted that the power supply modules shown in FIG. 3 and FIG. 4 both take the energy storage circuit as an example, which accordingly receive an AC input and provide a DC output. However, it is not limited thereto. For example, when applied to an inverter circuit, the power supply module receives a DC input and provides an AC output.

In some embodiments, the power module 22 in the water-cooling power module may only include a DC/DC converter that receives an AC input by utilizing a phase shifting transformer, and the input/output filter module 24 includes rectifying devices that rectify the output of the phase shifting transformer. A schematic diagram of the corresponding water-cooled power supply module may be referred to FIG. 5A and FIG. 5B. The power module 22 does not include any AC/DC converter, and correspondingly, the water-cooling power module does not include any AC/DC inductor module. As shown in FIG. 5A, the water-cooling power supply module includes: a water-cooling plate 1; and a power supply module disposed on the water-cooling plate 1. The power supply module includes: a capacitor module 21, a power module 22, a DC/DC inductor module 234, and an input/output filter module 24 arranged on the surface of the water-cooling plate. Further, these modules are sequentially arranged on the surface of the water-cooling plate. The power supply module further includes a control module 25 (not shown) disposed above the capacitor module or the power module. It should be noted that "sequentially arranged" in the present embodiment means that if the capacitor module is viewed as a start point, the power module 22, the DC/DC inductor module 234 and the input/output filter module 24 are sequentially disposed. In other words, the capacitor module 21 is next to the power module 22; the power module 22 is next to the DC/DC inductor module 234; and the DC/DC inductor module 234 is next to the input/output filter module 24. The input/output filter module 24, the DC/DC inductor module 234, the power module 22 and the capacitor 21 are connected to form a main power channel. The main current is sequentially transmitted to the input/output filter module 24, the capacitor module 21 and the power module 22 via the at least one input terminal, and subsequently transmitted to the input/output filter module 24 via the DC/DC inductor module 234, and transmitted to external devices via the at least one output terminal, so as to form a C-shaped main power channel Among them, the power module 22 is configured to perform the DC/DC conversion and transmit the DC current to the inductor module. According to an exemplary embodiment, one end of the DC/DC inductor module 234 is electrically connected to the input/output filter module 24, and the other end thereof is electrically connected to the power module. The current is transmitted via the DC/DC inductor module between the input/output filter module and the power module.

Figure 5B:
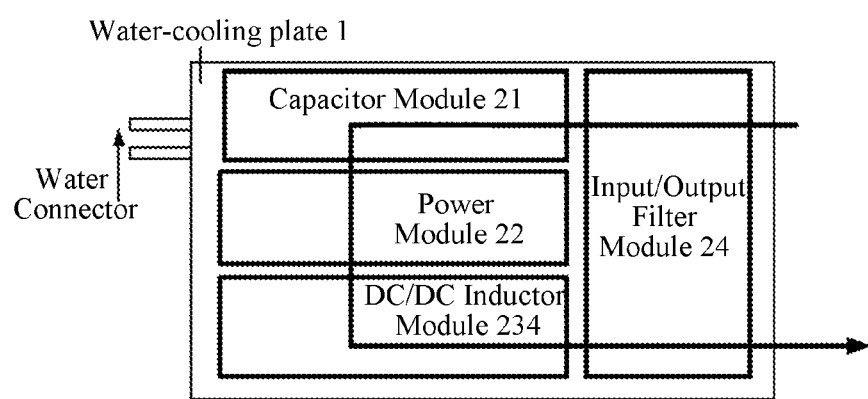

FIG. 5B shows a diagram of another water cooling module according to a different embodiment of the present invention. The main layout of the structure shown in FIG. 5B is similar with that of FIG. 5A, and thus detailed descriptions will be omitted here. As long as the arrangement of the respective modules is appropriately designed based on the shapes thereof, the same effect as that of FIG. 5A can be achieved.

In some embodiments, the water-cooling power module may only include an AC/DC converter. A schematic diagram of the corresponding water-cooled power supply module may be referred to FIG. 6A and FIG. 6B. The power module 22 does not include any DC/DC converter, and correspondingly, the water-cooling power module does not include any DC/DC inductor module. As shown in FIG. 6A, the water-cooling power supply module includes: a water-cooling plate 1; and a power supply module disposed on the water-cooling plate 1. The power supply module includes: a capacitor module 21, a power module 22, an AC/DC inductor module 234, and an input/output filter module 24 arranged on the surface of the water-cooling plate. Further, these modules are sequentially arranged on the surface of the water-cooling plate. The power supply module further includes a control module 25 (not shown) disposed above the capacitor module or the power module. It should be noted that "sequentially arranged" in the present embodiment means that if the capacitor module is viewed as a start point, the power module 22, the AC/DC inductor module 234 and the input/output filter module 24 are sequentially disposed. In other words, the capacitor module 21 is next to the power module 22; the power module 22 is next to the AC/DC inductor module 234; and the AC/DC inductor module 234 is next to the input/output filter module 24. The input/output filter module 24, the AC/DC inductor module 234, the power module 22 and the capacitor 21 are connected to form a main power channel. The main current is sequentially transmitted to the input/output filter module 24, the AC/DC inductor module 234, the power module 22 and the capacitor module 21 via the at least one input terminal, and subsequently transmitted to the input/output filter module 24, and transmitted to external devices via the at least one output terminal, so as to form a C-shaped main power channel Among them, the power module 22 is configured to perform the AC/DC conversion and transmit the DC current to the inductor module. According to an exemplary embodiment, one end of the AC/DC inductor module 234 is electrically connected to the input/output filter module 24, and the other end thereof is electrically connected to the power module. The current is transmitted via the AC/DC inductor module between the input/output filter module and the power module.

Figure 6B:
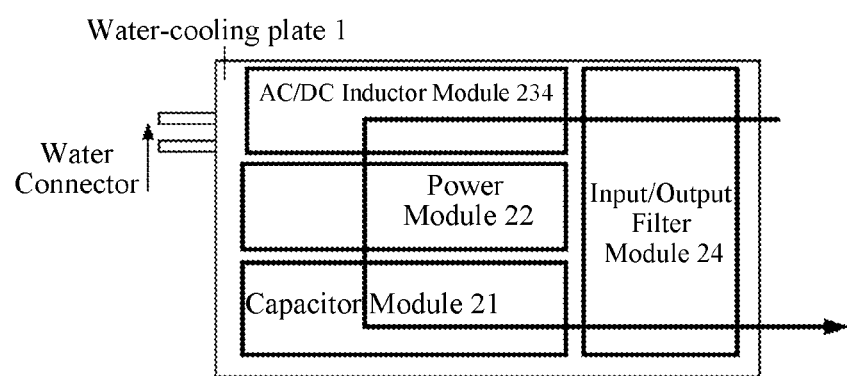

FIG. 6B shows a diagram of another water cooling module according to a different embodiment of the present invention. The main layout of the structure shown in FIG. 6B is similar with that of FIG. 6A, and thus detailed descriptions will be omitted here. As long as the arrangement of the respective modules is appropriately designed based on the shapes thereof, the same effect as that of FIG. 6A can be achieved.

FIG. 7 shows the basic structure of a water-cooling plate, wherein water channels are designed on the water-cooling plate and the cooling water in the water channels flows through the heat generating devices in the power supply module. The water channels in the water cooling plate are designed so that the cooling water can flow through the power module, the inductor modules and the input/output filter module sequentially to make said modules cooled in turn according to the loss. The water inlet and outlet of the water-cooling plate are located on its same side. Cooling water flows from the water inlet into the water cooling plate, and then flows sequentially through the water channels below the capacitor module, the power module, one part of the inductor modules, the input/output filter module, the other part of the inductor modules, and the capacitor module, and finally flows out of the water-cooling plate through the water outlet. The cooling water circulates in the water-cooling plate to make each module cooled. Since the power module has a large thermal resistance and induces a large loss, the water channels are arranged centrally below the power module. The design of the water channels below the power module is shown in the dashed box of FIG. 7. As shown in the figure, a plurality of water channels are arranged below the power module and connected in parallel. The less heat loss of the capacitor module results in the less water channels laid below, which can be neglected accordingly. Therefore, the water channels of the water-cooling plate are designed such that the cooling water delivered from the water inlet into the water-cooling plate first focus on cooling the power module, and then cools the inductor modules and the input/output filter module in turn.

FIG. 8 shows a physical diagram of a water-cooling power supply module according to one embodiment of the present invention. As shown in FIG. 8, a capacitor module 21, a power module 22, a plurality of inductor modules 231-234, and an input/output filter module 24 are disposed in order from left to right. The capacitor module 21 is disposed on the left side, and includes a plurality of electrolytic capacitors, a PCB board and connecting terminals, wherein a plurality of electrolytic capacitors and connecting terminals are disposed on the PCB board. The power module 22 is disposed adjacent to the capacitor module 21 and includes switching devices, a driving circuit, high voltage filter capacitors, a PCB board, and connecting terminals, wherein the switching devices, the driving circuit, the high voltage filter capacitors and the connecting terminals are disposed on the PCB, the switch devices can be an encapsulated IGBT (Insulated Gate Bipolar Transistor) module, a SIC module (silicon carbide module) or a MOSFET (metal oxide semiconductor field effect transistor) module. It can be a single component produced by encapsulating a discrete T0247 or T0220. A plurality of inductor modules (231-234) are disposed adjacent to the power module 22, each of which includes a single inductor or multiple inductors, a PCB board and connecting terminals, wherein the single inductor or the multiple inductors and connecting terminals are disposed on the PCB board. When the inductor module includes a plurality of inductors, the inductors are connected in parallel or in series to attain the desired amount of inductance. The input/output filter module 24 is disposed adjacent to a plurality of inductor modules, and includes common mode inductors, differential mode inductors, a Y capacitor, an X capacitor, relays, fuses, electrolytic capacitors, a PCB board and connecting terminals, wherein the common mode inductors, the differential mode inductors, the Y capacitor, the X capacitor, the relays, the fuses, the electrolytic capacitors and connecting terminals are disposed on the PCB board. The control module 25 is disposed above the power module, and includes a voltage and current sampling processing circuit, a control circuit, a communication line, a PCB board, and connecting terminals, wherein the voltage and current sampling processing circuit, the control circuit, the communication line and the connecting terminals are disposed on the PCB board. The control module is further used for the communication between the water-cooling power supply module and an external system. The input/output terminal 241 is disposed at the far right side of the power supply module and is connected to the input/output filter module 24.

The water channels in the water-cooling plate are designed such that the cooling water flows through the power module, the inductor modules and the input/output filter module in sequence, that is, the cooling water is first focus on cooling the power module and then cools the inductor modules and the input/output filter module in turn. The control module is disposed above the power module, and the sheet metal parts are arranged therebetween for separating and supporting. Four inductor modules are electrically connected to the power module and the input/output filter modules, and each of the inductor modules is glue potting inductor and adhered to the water-cooling plate to be cooled. Due to the above-mentioned structure pattern, the space inside the power supply module can completely utilized, and the space utilization and the power density of the whole machine can be improved accordingly. The water-cooling power supply module shown in FIG. 8 has a power up to 68 KW, however, its volume is only 760 mm×420 mm×71 mm, and therefore, it has a compact structure and a high power density.

In the water-cooling power supply module shown in FIG. 8, the PCB board of the capacitor module is electrically connected to one end of the PCB board of the power module; the other end of the PCB board of the power module is electrically connected to one end of the PCB board of a plurality of inductor modules; the other end of the PCB board of a plurality of inductor modules is electrically connected to one end of the PCB board of the input/output filter module; the other end of the PCB board of the input/output filter module is electrically connected to the input/output terminals. There is a height difference between adjacent PCB boards, and the connecting module can be used to achieve the electrical connection between adjacent PCB boards, that is, to achieve the electrical connection of connecting terminals in adjacent PCB boards. The connecting terminals of the PCB board can be via holes provided in the PCB board and the pads around them. However, the present invention is not limited thereto, and the connecting terminals can be designed as desired to achieve the electrical connections between the modules.

There are many different ways for the control module to be placed above the power module or the capacitor module. FIG. 9 shows a schematic diagram of the installation of the control module according to one embodiment of the present invention. As shown in FIG. 9, a plurality of support columns 261 are disposed at one end of the capacitor module or the power module, and the other end of the capacitor module or the power module is adjacent to the casing 3 of the water-cooling power supply module. A support plate 262 is disposed on a plurality of support columns 261. One end of the support plate is supported by the support columns, and the other end of the support plate is supported by the casing. An insulating pad 263 is disposed above the support plate, and the control module is disposed on the insulating pad. The end of the support plate 262 supported by the casing is provided with a flange 264. The flange 264 has a plurality of screw holes, and is overlapped on the casing 3 and fixed to the casing 3 by screws. The support plate 262 is a conductor made of a conductive material (such as aluminum), and is fixedly connected to the casing. The casing is connected to the earth to shield the interference signal.

According to another embodiment of the present invention, both ends of the control module are supported by support columns (not shown). Specifically, a plurality of support columns are disposed at opposite ends of the capacitor module or the power module, and a support plate and an insulating pad are disposed on a plurality of support columns. Consequently, both ends of the support plate are supported by the support columns, and the control module is disposed on the insulating pad.

The connection of the current paths between two adjacent modules is realized by the connecting module, which will be described below with reference to FIGS. 10-12 respectively. The PCB boards of adjacent modules on the surface of the water-cooling plate are electrically connected by a connecting module. The height of the connecting module is determined by the height difference between adjacent PCB boards, and the size and thickness of the connecting module are related to the current flowing in it. Generally, the current density in the connecting module is less than 5 A/mm$^2$. The connecting module is usually made of the materials such as brass, pure copper or the like. FIG. 10 shows three structures of the connecting module, and the connecting module can also be a combination of any two structures in FIG. 10, but the invention is not limited thereto.

As shown in FIGS. 10 and 11, the connecting module includes a first connecting member 91 (for example, the connecting module (a) in FIG. 10) and a second connecting member 92 (for example, the connecting module (c) in FIG. 10) that mate with each other. The sum of the heights of the first connecting member 91 and the second connecting member 92 is approximately equal to the height difference between the adjacent PCB boards 93 and 94. The first connecting member 91 has pins at one end, and is fixedly connected to one of the PCB boards through the pins and fasteners (for example, screws). Particularly, the first connecting member 91 has four pins at one end, and correspondingly, the PCB board 93 has four via holes. Each of the pins is inserted into one via hole, and is fixed by screws. The first connecting member 91 and the PCB board are electrically connected through via holes and pads around via holes. That is, the electrically connection between the first connecting member 91 and the connecting terminals disposed in the PCB board 93 can be achieved. The second connecting member has pins at one end, and is fixedly connected to the other PCB board through the pins and fasteners. Particularly, the second connecting member 92 has four pins at one end, and correspondingly, the PCB board 94 has four via holes. Each of the pins is inserted into one via hole, and is fixed by screws. The second connecting member 92 and the PCB board are electrically connected through via holes and pads around via holes. That is, the electrically connection between the second connecting member 92 and the connecting terminals disposed in the PCB board 94 can be achieved. The other end of the first connecting member and the other end of the second connecting member are fixedly connected by a fastener, and the first connecting member 91 and the second connecting member 92 are electrically connected, and finally the PCB board 93 and the PCB board 94 are electrically connected, that is, the electrical connection between the adjacent modules is achieved. It should be noted that the height of each of the first connecting member 91 and the second connecting member 92 does not include that of the pin attached. The first connecting member 91 and the second connecting member 92 are made of copper. The connection between the power module and the inductor module, or the connection between the inductor module and the input/output filter module, all can be achieved by employing the structure described in FIG. 11. The connecting module with this structure occupies less space on the PCB board, which allows the PCB board to be more compact to realize the miniaturization of the water-cooling power supply module.

Figure 12:
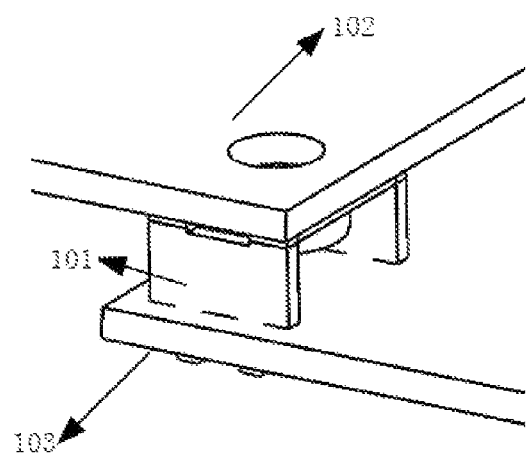
FIG. 12 shows a schematic diagram of a connecting module according to another embodiment of the present invention.

As shown in FIGS. 10 and 12, the connecting module includes a connecting member 101 (which may be, for example, the connecting module (b) of FIG. 10), and the height of the connecting member 101 is approximately equal to the height difference between adjacent PCB boards 102 and 103. The connecting member 101 has pins at one end and is fixedly connected to one of the PCB boards by the pins and fasteners (for example, screws). The connecting member 101 has four pins at one end, and correspondingly, the PCB board 102 has four via holes. Each of the pins is inserted into one via hole, and is fixed by screws. The connecting member 101 and the PCB board 102 are electrically connected through via holes and pads around via holes. That is, the electrically connection between the connecting member 101 and the connecting terminals disposed in the PCB board 102 can be achieved. The other end of the connecting member 101 is provided with screw holes, and correspondingly, the PCB board 103 has via holes. The other end of the connecting member 101 is fixedly connected to the PCB board 103 by fasteners. For example, screw holes on the other end of the connecting member 101 and via holes on the PCB board 103 are connected through the screws. The connecting member 101 and the PCB board 103 are electrically connected through via holes and pads around via holes. That is, the electrically connection between the connecting member 101 and the connecting terminals disposed in the PCB board 103 can be achieved. Finally, the PCB board 102 and the PCB board 103 are electrically connected, that is, the electrical connection between the adjacent modules is achieved. Similarly, the height of the connecting member 101 does not include that of the pin attached. The connection between the power module and the capacitor module can be achieved by employing the structure described in FIG. 12. The connecting module with this structure allows the connection to be realized in a simple way and has less inductance.

FIG. 13 shows an equivalent circuit analysis diagram of the parasitic inductance of the power module to the capacitor module. When the switching current in the AC/DC or DC/DC converter is large, oscillation will appear between the parasitic inductance Lpara1-Lpara6 and the electrolytic capacitors CB1, CB2. If the oscillating energy is too large, the voltage spike of the switching device will be extremely high, which will make the device damaged. Based on the electromagnetic field theory, the laminated power bus usually has a flat cross-section, and provided that the area of the cross section is a constant, the power bus which is much thinner and wider will cause smaller parasitic inductance. If the current in adjacent wires flow in opposite directions respectively, the magnetic fields generated can cancel each other out, which can also reduce the parasitic inductance. Therefore, in order to reduce the parasitic inductance, copper is laid on different layers in the PCB boards of the power module and the capacitor module. The terminals (B+, 0, B−) formed by a plurality of electrolytic capacitors in the capacitor module are laid on the different layers in the PCB board of the capacitor module. The bus terminals (P+, 0, P−) formed in the power module are laid on different layers in the PCB board of the power module, and the high frequency currents in the adjacent layers flow in opposite directions to reduce the parasitic inductance. While, at least two sets of parallel connection terminals are arranged at the joint between the power module and the capacitor module, which can significantly reduce the parasitic inductance between the power component and the electrolytic capacitor within a range less than 500 Nh. The following description will be made with reference to FIGS. 14-17, respectively.

The PCB board of the capacitor module includes a plurality of layers. As shown in FIG. 14, each of the layers in the PCB board is indicated as 21a, 21b and 21c, respectively. A plurality of electrolytic capacitors form at least one set of zero terminal 0, positive terminal B+ and negative terminal B−. In FIG. 14, two sets of terminals (B+, 0, B−) are illustrated. The shadow region in FIG. 14 indicates the area with copper laid. The zero terminal 0, the positive terminal B+, and the negative terminal B− are laid on different layers in the PCB board respectively, and the high-frequency currents in the adjacent layers of the PCB board flow in opposite directions. The positive terminal B+ of the electrolytic capacitor is laid on the layer 21a, and the negative terminal B− and the zero terminal 0 of the electrolytic capacitor are shielded on this layer, that is, on the layer 21a, the positive terminal B+ is covered with copper on the entire surface, while the negative terminal B− and zero terminal 0 are laid without copper. The negative terminal B− of the electrolytic capacitor is laid on the layer 21b, and the positive terminal B+ and the zero terminal 0 of the electrolytic capacitor are shielded on this layer, that is, on this layer, the negative terminal B− is covered with copper on the entire surface, while the positive terminal B+ and zero terminal 0 are laid without copper. Generally speaking, the layer where the zero terminal 0 is laid is taken as the first layer. Taking the four-layer PCB board as an example, the four layers are connected from the first layer to the fourth layer in turn, and the first layer, the second layer, the third layer and the fourth layer correspond to 21c, 21a, 21b, 21c, respectively, that is, 21c, 21a, 21b, 21c are sequentially laminated. The zero terminal 0 of the electrolytic capacitor is connected to the first layer 21c, and is also connected to the fourth layer 21c below through one via hole in the PCB board. The positive terminal B+ of the electrolytic capacitor is connected to the second layer 21a through one via hole in the PCB board. The negative terminal B− of the electrolytic capacitor is connected to the third layer 21b through one via hole in the PCB board. Finally, as shown in FIG. 16, two sets of terminals (B+, 0, B−) are formed on the PCB board as the connection terminals of the capacitor module, which are electrically connected to the connection terminals of the power module. The copper-covering regions in 21a, 21b and 21c overlap in a large area, preferably totally overlap, and the currents in the adjacent layers flow in opposite directions to reduce the parasitic inductance. The cross section of the copper-covering region on each layer is a rectangle with an aspect ratio greater than 10, that is, the copper layer in the PCB board is thin and wide.

The PCB board of the power module includes a plurality of layers. As shown in FIG. 15, each of the layers in the PCB board is indicated as 22a, 22b and 22c, respectively. The power module has at least one set of zero terminal 0, positive bus terminal P+ and negative bus terminal P−. In FIG. 15, two sets of terminals (P+, 0, P−) are illustrated. Since the configuration of the terminals in FIG. 15 is similar as that in FIG. 14, the details can refer to the description of FIG. 14 and will not be described herein again. Finally, two sets of terminals (P+, 0, P−) are formed on the PCB board of the power module as the connection terminals of the power module, which are electrically connected to the terminals (B+, 0, B−) of the capacitor module, respectively. It should be noted that the configuration of each terminal in the power module is not limited thereto, and may be modified as desired.

According to one embodiment of the present invention, the capacitor module is provided with two or more sets of positive terminals, zero terminals and negative terminals, and the DC bus of the power module is provided with two or more sets of positive bus terminals, neutral terminals and negative bus terminals. Accordingly, the electrical connection between the PCB boards of the capacitor module and the power module can be achieved through at least two sets of terminals (B+, 0, B−) disposed on the PCB of the capacitor module and at least two sets of terminals (P+, 0, P−) disposed on the PCB of the power module. Thereby, the parasitic inductance between the power components and the bus capacitors can be significantly reduced. FIG. 16 and FIG. 17 show that the parasitic inductance is reduced by the parallel connection through two and three sets of terminals, respectively. Each set of terminals (B+, 0, B−) on the PCB board of the capacitor module 21 is connected to a corresponding set of terminals (P+, 0, P−) on the PCB board of the power module 22. Specifically, the positive terminal B+ is electrically connected to the corresponding positive bus terminal P+ through the connecting module, the negative terminal B− is electrically connected to the corresponding negative bus terminal P− through the connecting module, and the zero terminal 0 is electrically connected to the corresponding neutral terminal 0 through the connecting module.

Since the components in the capacitor module and the input/output filter module are smaller, the loss of a single electrolytic capacitor is less than 5 W, and the loss of a single filter inductor is less than 20 W. Therefore, the problem of heat dissipation can be solved by disposing a heat conducting medium (such as thermal pad, thermal paste, ceramic sheet, etc.) between the water-cooling plate 1 and the PCB board(s) of the capacitor module 21 and/or the input/output filter module 24. As shown in FIG. 18, a heat conducting medium 27 is provided between the input/output filter module 24 and the water-cooling plate 1. It is advantageous to use the heat conducting medium for the non-strict requirements (the area and the thickness of the heat conducting medium can be large). And the process of the heat conducting medium is simple, and the price of the heat conducting medium is cheaper. In this embodiment, a thermal pad is disposed on the bottom layer of the capacitor module and is in contact with the water-cooling plate to allow the components in the capacitor module to dissipate the heat. Similarly, a thermal pad is disposed on the bottom layer of the input/output filter module and is in contact with the water-cooling plate to allow the components in the input/output filter module to dissipate the heat. The thermal resistance of the switching component is larger, and the loss is generally greater than 20 W. Therefore, the power module must dissipate the heat through the heat dissipating adhesive, which is very thin (less than 100 μm) and in contact with the water-cooling plate directly. The energy storage inductor in the inductor module has a loss more than 20 W. By adding special heat dissipating adhesive (such as CN8760GA/B) to the heat dissipating housing (such as aluminum housing) of the inductor module, the heat dissipating area can be increased.

From the above description, those skilled in the art will readily appreciate that the water-cooling power supply module according to the embodiments of the present invention has one or more of the following advantages.

In the water-cooling power supply module according to the present invention, a heat-conducting medium is disposed between each of the capacitor module and the input/output filter module and the water-cooling plate. For example, each of the EMI filter inductors, electrolytic capacitors, and fuses dissipate the heat through the thermal pads disposed between the respective PCB board and the water-cooling plate. The capacitor module and the power module are connected in parallel through two or more terminals to reduce the parasitic inductance between the switching element and the electrolytic capacitor. The PCB boards of the adjacent modules are electrically connected to each other by a connecting module (generally a copper structure), to overcome the problem related to the height difference between the adjacent PCB boards and realize large current interconnection. The SiC module with height of 12 mm can be used as the power module, and the control module is disposed above the power module. With the structure pattern as described in the present invention, the power components of the water-cooling power supply module can have a shutoff speed less than 100 ns so as to operate safely at a peak current of 160 A, and the water-cooling power supply module can have a full load efficiency greater than 97% and a power density greater than 45 W/inch$^3$.

According to some embodiments of the present invention, by disposing the control module above the power module or the capacitor module, the disturbance to the control signal during transmission can be avoided.

According to other embodiments of the present invention, the water channels in the water-cooling plate are designed such that the cooling water flows through the power module, the inductor modules, and the input/output filter module in sequence. Therefore, each of those modules can be cooled in sequence according to the loss, that is, the cooling water is first focus on cooling the power module and then cools the inductor modules and the input/output filter module in turn, so as to improve the heat dissipation efficiency accordingly.

According to still other embodiments of the present invention, the input/output filter module, the inductor modules, the capacitor module and the power module form a C-shaped main power channel, and the main current is transmitted along the C-shaped main power channel, thereby shortening the conduction loop and reducing the conduction loss.

According to still other embodiments of the present invention, since a plurality of inductor modules are used as connection bridges between the power module and the input/output filter module, the compact structure and the simple connection can be achieved, and accordingly, not only the space utilization and the power density of the power supply module can be improved, but also the electromagnetic interference generated during current transmission can be avoided.

After reading the specification and implementing the embodiments as described herein, the other embodiments of the invention will be apparent to those skilled in the art. The present invention is intended to cover any variations, uses, or modifications, which are in accordance with the general principles of the present invention and include well known prior art or common technical means in the art that are not disclosed in the present invention. The specification and embodiments are to be regarded as illustrative only, and the true scope and spirit of the invention are declared by the following claims.

It is to be understood that the invention is not limited to the extra structures as described above and shown in the drawings, and various modifications and changes can be made without departing from the scope thereof. The scope of the invention is limited only by the appended claims.

What is claimed is:
1. A water-cooling power supply module, comprising:
 a water-cooling plate;
 a power supply module disposed on the water-cooling plate, the power supply module comprising:
 a capacitor module, including a plurality of capacitors;
 a power module, including switching devices, a driving circuit, and filter capacitors disposed on a PCB board;
 at least one inductor module, wherein each of the at least one inductor module includes a single inductor or multiple inductors;
 an input/output filter module, including a plurality of filter elements; and a control module, including sampling processing circuit and control circuits; wherein the capacitor module, the power module, the at least one inductor module and the input/output filter module are arranged on a surface of the water-cooling plate; and the control module is disposed above the capacitor module or the power module, for at least controlling the power module, wherein at least one support column is disposed on at least one end of the capacitor module or the power module, a support plate and an insulating pad are disposed on the at least one support column, and the control module is disposed on the insulating pad;

wherein water channels in the water-cooling plate are designed such that cooling water flows through the power module, the inductor modules and the input/output filter module in sequence.

2. The water-cooling power supply module according to claim 1, wherein one end of each inductor module is electrically connected to the input/output filter module, the other end is electrically connected to the power module, and current is transmitted between the input/output filter module and the power module via the at least one inductor module.

3. The water-cooling power supply module according to claim 1, wherein a plurality of the support columns are disposed at opposite ends of the capacitor module or the power module; and the support plate and the insulating pad are disposed on the plurality of support columns.

4. The water-cooling power supply module according to claim 1, wherein a plurality of the support columns are disposed on one end of the capacitor module or the power module, and the other end of the capacitor module or the power module is adjacent to a housing of the water-cooling power supply module; the support plate is disposed on the plurality of support columns, and one end of the support plate is supported by the plurality of support columns and the other end of the support plate is supported by the housing; and the insulating pad is disposed on the support plate.

5. The water-cooling power supply module according to claim 1, wherein, the capacitor module further includes a plurality of electrolytic capacitors, a PCB board and connecting terminals, and the plurality of electrolytic capacitors and the connecting terminals are disposed on the PCB board;

the power module further includes high voltage filter capacitors and connecting terminals, wherein the switching devices, the driving circuit, the high voltage filter capacitors and the connecting terminals are disposed on the PCB board;

each of the at least one inductor module further includes a PCB board and connecting terminals, and the single inductor or the multiple inductors and the connecting terminals are disposed on the PCB board;

the input/output filter module further includes common mode inductors, differential mode inductors, a Y capacitor, a X capacitor, relays, fuses, electrolytic capacitors, a PCB board and connecting terminals, wherein the common mode inductors, the differential mode inductors, the Y capacitor, the X capacitor, the relays, the fuses, the electrolytic capacitors and the connecting terminals are disposed on the PCB board; and the control module further includes voltage and current sampling processing lines, control lines, communication lines, a PCB board and connecting terminals, wherein the voltage and current sampling processing lines, the control lines, the communication lines and the connecting terminals are disposed on the PCB board, and wherein the control module is further configured for communicating between the water-cooling power supply module and external devices.

6. The water-cooling power supply module according to claim 5, wherein the PCB boards included in adjacent modules on the surface of the water-cooling plate are electrically connected via connecting modules.

7. The water-cooling power supply module according to claim 6, wherein each of the connecting modules includes a first connecting member and a second connecting member that mate with each other, and the sum of heights of the first connecting member and the second connecting member is equal to the height difference between adjacent PCB boards.

8. The water-cooling power supply module according to claim 7, wherein one end of the first connecting member is provided with pins and is fixedly connected to one of the PCB boards by the pins and fasteners; one end of the second connecting member is provided with pins and is fixedly connected to the other PCB board by the pins and fasteners; and the other end of the first connecting member and the other end of the second connecting member are fixedly connected by fasteners.

9. The water-cooling power supply module according to claim 6, wherein the connecting module includes a connecting member, the height of the connecting member is equal to the height difference between adjacent PCB boards, one end of the connecting member is provided with pins and is fixedly connected with one of the PCB boards by the pins and fasteners, and the other end of the connecting member is provided with screw holes and is fixedly connected to the other PCB board by fasteners.

10. The water-cooling power supply module according to claim 6, wherein the PCB board in the capacitor module includes a plurality of layers, and the plurality of electrolytic capacitors form at least one set of zero terminals, positive terminals and negative terminals which are respectively laid on the different layers in the PCB board, and high-frequency currents in the adjacent layers of the PCB board in the capacitor module flow in opposite directions.

11. The water-cooling power supply module according to claim 10, wherein at least one set of positive bus terminals, neutral terminals and negative bus terminals are disposed on the PCB board of the power module, and each set of positive terminals, zero terminals and negative terminals on the PCB board of the capacitor module are electrically connected to a set of positive bus terminals, neutral terminals and negative bus terminals on the PCB of the power module, respectively.

12. The water-cooling power supply module according to claim 11, wherein the plurality of electrolytic capacitors form two or more sets of positive terminals, zero terminals and negative terminals, and a DC bus of the power module includes two or more sets of positive bus terminals, neutral terminals and negative bus terminals.

13. The water-cooling power supply module according to claim 1, wherein the power supply module further includes at least one input terminal and at least one output terminal, and the at least one input terminal and the at least one output terminal are located on the same side of the power supply module and are connected to the input/output filter module.

14. The water-cooling power supply module according to claim 13, wherein the at least one inductor module includes AC/DC inductor modules and a DC/DC inductor module, a main current is sequentially transmitted to the input/output filter module, the AC/DC inductor module, the power module, the capacitor module and the power module via the at least one input terminal, and subsequently transmitted to the input/output filter module via the DC/DC inductor module, and transmitted to external devices via the at least one output terminal, so as to form a C-shaped main power channel.

15. The water-cooling power supply module according to claim 13, wherein the at least one inductor module includes a DC/DC inductor module, a main current is sequentially transmitted to the input/output filter module, the capacitor module, and the power module via the at least one input terminal, and subsequently transmitted to the input/output filter module via the DC/DC inductor module, and transmitted to external devices via the at least one output terminal, so as to form a C-shaped main power channel.

16. The water-cooling power supply module according to claim 13, wherein the at least one inductor module includes an AC/DC inductor module, a main current is sequentially transmitted to the input/output filter module, the AC/DC inductor module, the power module, the capacitor module via the at least one input terminal, and subsequently transmitted to the input/output filter module, and transmitted to external devices via the at least one output terminal, so as to form a C-shaped main power channel.

17. The water-cooling power supply module according to claim 1, wherein the water-cooling power supply module further includes a heat-conducting medium disposed between the capacitor module and the water-cooling plate.

18. The water-cooling power supply module according to claim 1, wherein the water-cooling power supply module further includes a heat-conducting medium disposed between the input/output filter module and the water-cooling plate.

19. The water-cooling power supply module according to claim 1, wherein the water-cooling power supply module further includes heat dissipating adhesive disposed between the power module and the water-cooling plate, and a thickness of the heat dissipating adhesive is less than 100 μm.

20. The water-cooling power supply module according to claim 1, wherein a heat dissipating housing of the inductor module is filled with heat dissipating adhesive.

* * * * *